United States Patent
Iwasaki

(10) Patent No.: US 8,653,650 B2
(45) Date of Patent: *Feb. 18, 2014

(54) SEMICONDUCTOR DEVICE WITH ACENE HEAT SPREADER

(75) Inventor: Tomio Iwasaki, Tsukuba (JP)

(73) Assignee: Hitachi, Ltd., Tokyo (JP)

( * ) Notice: Subject to any disclaimer, the term of this patent is extended or adjusted under 35 U.S.C. 154(b) by 303 days.

This patent is subject to a terminal disclaimer.

(21) Appl. No.: 12/805,834

(22) Filed: Aug. 20, 2010

(65) Prior Publication Data

US 2011/0049689 A1 Mar. 3, 2011

(30) Foreign Application Priority Data

Aug. 31, 2009 (JP) ................................. 2009-199189

(51) Int. Cl.
*H01L 23/14* (2006.01)
(52) U.S. Cl.
USPC .................................. 257/702; 257/E23.119
(58) Field of Classification Search
USPC .......................................... 257/702, E23.119
See application file for complete search history.

(56) References Cited

U.S. PATENT DOCUMENTS

| 2005/0014088 A1* | 1/2005 | Nakamura et al. .......... 430/270.1 |
| 2005/0023665 A1* | 2/2005 | Ledwidge ..................... 257/679 |
| 2005/0029640 A1* | 2/2005 | Amano et al. ................ 257/678 |

FOREIGN PATENT DOCUMENTS

| JP | 9-195068 | 7/1997 |
| JP | 2003-282798 | 10/2003 |

* cited by examiner

*Primary Examiner* — Steven J Fulk
(74) *Attorney, Agent, or Firm* — Antonelli, Terry, Stout & Kraus, LLP.

(57) ABSTRACT

A semiconductor device in which an adhesion between a lead and a sealing body (mold sealing body) is improved to prevent the peering is provided. In a semiconductor device having a semiconductor chip, a plurality of leads electrically connected to the semiconductor chip and mainly made of metal and a sealing body for sealing the semiconductor chip, in order to improve the adhesion between the lead and the sealing body (mold sealing body), a material combination with good lattice matching is used as a combination of a surface material of the lead and a material of the sealing body, and the sealing body mainly made of acene is used.

6 Claims, 13 Drawing Sheets

RELATIONS IN YOUNG'S MODULUS OF CONVENTIONAL MATERIALS: Erm<Er<Em, Erc<Er<Ec

RELATIONS IN YOUNG'S MODULUS OF CONVENTIONAL MATERIALS: Erm<Er<Em, Erc<Er<Ec

RELATIONS IN YOUNG'S MODULUS OF PRESENT INVENTION: Eo<Eom<Em, Eo<Eoc<Ec

RELATIONS IN YOUNG'S MODULUS OF PRESENT INVENTION : $E_o < E_{om} < E_m$, $E_o < E_{oc} < E_c$

SEMICONDUCTOR DEVICE WITH ACENE HEAT SPREADER

CROSS-REFERENCE TO RELATED APPLICATION

The present application claims priority from Japanese Patent Application No. 2009-199189 filed on Aug. 31, 2009, the content of which is hereby incorporated by reference to this application.

TECHNICAL FIELD OF THE INVENTION

The present invention relates to a semiconductor device and a manufacturing technology thereof, and more particularly to a technology effectively applied to a semiconductor device having a structure in which an organic matter is used as a sealing body for sealing a semiconductor chip and to its manufacture.

BACKGROUND OF THE INVENTION

Japanese Patent Application Laid-Open Publication No. 9-195068 (Patent Document 1) discloses a method in which, after Cu strike plating is performed to a lead base material made of Cu alloy as base plating, silver, gold, palladium and others for wire bonding or die bonding are partially plated, and then a semiconductor chip having leads connected thereto is sealed with a sealing body or the like. Also, Japanese Patent Application Laid-Open Publication No. 2003-282798 (Patent Document 2) discloses a semiconductor device using a sealing body in which a thermosetting resin with a high heat conductivity is used as matrix and an inorganic ceramics powder is used as filler (filling material) in order to improve the heat dissipation characteristics.

SUMMARY OF THE INVENTION

With the recent development of the mobile devices, the packaging density in a semiconductor device has been more and more increasing from the needs for the higher performance and the size and weight reduction. As a result, various types of package structures such as DIP (Dual Inline Plastic Package), SOP (Small Outline Plastic Package), SOJ (Small Outline J-lead Plastic Package), QFP (Quad Flat Plastic Package), TSOP (Thin Small Outline Plastic Package), TSOJ (Thin Small Outline J-lead Plastic Package) and TQFP (Thin Quad Flat Plastic Package) have been developed. In such a circumstance, since the heat generation density of a chip has been increasing, it has become impossible to ensure the sufficient heat dissipation characteristics even when the sealing body in which a thermosetting resin with a high heat conductivity is used as matrix and an inorganic ceramics powder is used as filler (filling material) as described in the Patent Document 2 (Japanese Patent Application Laid-Open Publication No. 2003-282798) is used.

Therefore, an object of the present invention is to provide a semiconductor device with improved heat dissipation characteristics. Further, another object of the present invention is to provide a manufacturing method of a semiconductor device with improved heat dissipation characteristics.

The inventors of the present invention studied hard for obtaining the means for improving the heat dissipation characteristics in a semiconductor device having a semiconductor chip, a plurality of leads electrically connected to the semiconductor chip and mainly made of metal and a sealing body for sealing the semiconductor chip. As a result, it was found that it is effective to use the combination of a surface material of the lead and a matrix organic matter for the sealing body, in which the Young's modulus at an interface portion between the surface material of the lead and the matrix organic matter for the sealing body is smaller than the Young's modulus of the surface material of the lead and larger than the Young's modulus of the matrix organic matter for the sealing body. Further, it was also found that it is effective to use the combination of a matrix organic matter for the sealing body and an inorganic ceramics powder contained therein as filler (filling material), in which the Young's modulus at an interface portion between the inorganic ceramics powder and the matrix organic matter for the sealing body is smaller than the Young's modulus of the inorganic ceramics powder and larger than the Young's modulus of the matrix organic matter for the sealing body.

More specifically, (1) in a semiconductor device having a semiconductor chip, a plurality of leads electrically connected to the semiconductor chip and mainly made of metal and a sealing body for sealing the semiconductor chip, it is effective that a material having acene as a matrix organic matter is used for the sealing body.

(2) In a semiconductor device having a semiconductor chip, a plurality of leads electrically connected to the semiconductor chip and mainly made of metal and a sealing body for sealing the semiconductor chip, it is effective that a material having at least one acene selected from the group of tetracene, pentacene and hexacene as a matrix organic matter is used for the sealing body.

(3) In a semiconductor device having a semiconductor chip, a plurality of leads electrically connected to the semiconductor chip and mainly made of metal and a sealing body for sealing the semiconductor chip, it is effective that a material having at least one acene selected from the group of tetracene, pentacene and hexacene as a matrix organic matter is used for the sealing body and an inorganic ceramics powder is contained as filler (filling material) in the sealing body.

(4) In a semiconductor device having a semiconductor chip, a plurality of leads electrically connected to the semiconductor chip and mainly made of metal and a sealing body for sealing the semiconductor chip, it is effective that a material having at least one acene selected from the group of tetracene, pentacene and hexacene as a matrix organic matter is used for the sealing body and an inorganic ceramics powder made of at least one selected from the group of boron nitride and aluminum nitride is contained as filler (filling material) in the sealing body.

(5) In a semiconductor device having a semiconductor chip, a plurality of leads electrically connected to the semiconductor chip and mainly made of metal and a sealing body for sealing the semiconductor chip, it is further effective that a material having at least one acene selected from the group of tetracene, pentacene and hexacene as a matrix organic matter is used for the sealing body, 12% or more to 85% or less of CH bond of the acene is replaced by COOH, COH, $CNH_2$ and CS, and an inorganic ceramics powder made of at least one selected from the group of boron nitride and aluminum nitride is contained as filler (filling material) in the sealing body.

(6) In a semiconductor device having a semiconductor chip, a plurality of leads electrically connected to the semiconductor chip and mainly made of metal and a sealing body for sealing the semiconductor chip wherein each part of the plurality of leads has an outer lead portion exposed from the sealing body and an inner lead portion embedded in the sealing body, it is further effective that a material having at least one acene selected from the group of tetracene, pentacene and hexacene as a matrix organic matter is used for the sealing body, 12% or more to 85% or less of CH bond of the acene is replaced by COOH, COH, $CNH_2$ and CS, an inorganic ceramics powder made of at least one selected from the group of boron nitride and aluminum nitride is contained as filler (filling material) in the sealing body, resin made of at least one selected from the group of epoxy resin, polyester resin, phenol resin and acrylic resin is contained as an additive in the sealing body, and a material mainly made of copper or palladium is used for a surface material of the inner lead portion.

According to the present invention, it is possible to provide a semiconductor device with improved heat dissipation characteristics capable of preventing the occurrence of the failure. Further, a semiconductor device with high reliability can be provided and a manufacturing method of a semiconductor device with high yield can be provided.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments in principle, and the repetitive description thereof is omitted.

First Embodiment

Hereinafter, an embodiment of the present invention will be described in detail based on the examples shown in the accompanying drawings.

Figure 1:
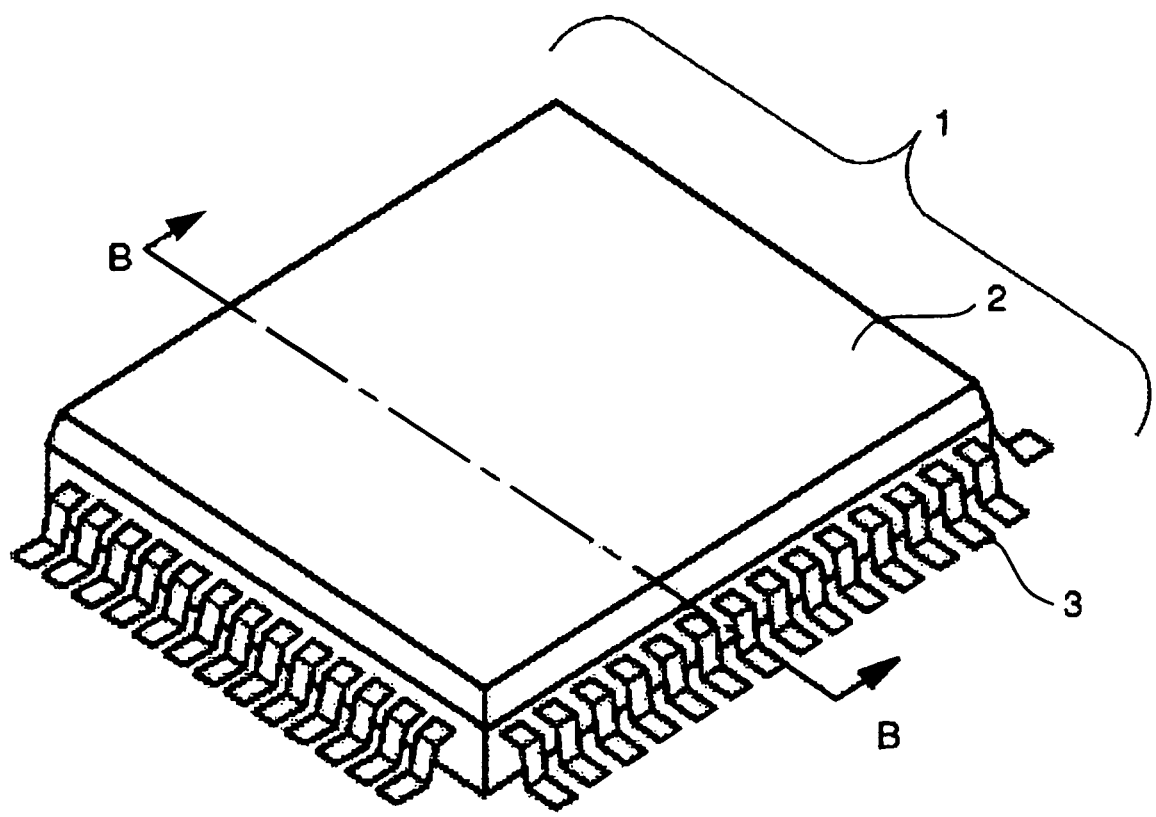
FIG. 1 is a perspective view showing an outer appearance of a semiconductor device according to the first embodiment of the present invention.
Figure 2:
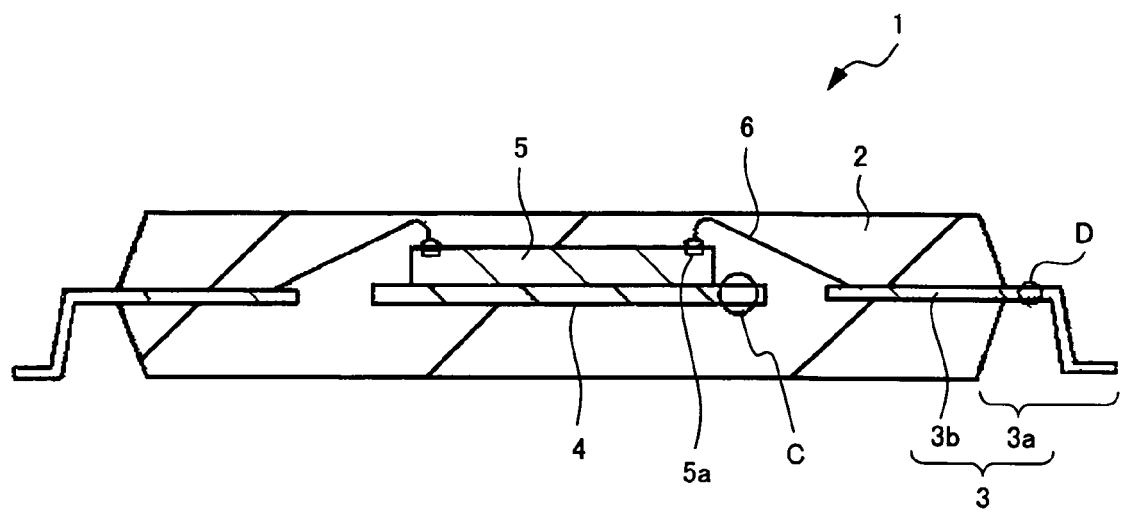
FIG. 2 is a cross-sectional view showing the cross section taken along the line A-B in FIG. 1.

First, FIG. 1 shows a perspective view of a semiconductor device according to the first embodiment of the present invention. Also, FIG. 2 shows a cross-sectional view taken along the line A-B in FIG. 1. The package type of the semiconductor device according to the present embodiment is QFP (Quad Flat Package).

As shown in FIG. 1, a semiconductor device 1 according to the first embodiment is covered with a sealing body 2 having an organic matter as a matrix material, and leads 3 are protruded from four side surfaces of the sealing body 2. The lead 3 has a structure bent into an L shape.

Also, as shown in FIG. 2, the lead 3 is made up of an outer lead 3a protruded from the side surface of the sealing body 2 and an inner lead 3b formed inside the sealing body 2. In a central portion sandwiched by left and right inner leads 3b (surrounded by a plurality of inner leads 3b), a tab 4 is formed and a semiconductor chip 5 is disposed on the tab 4. In the semiconductor chip 5, circuit elements such as MISFET (Metal Insulator Semiconductor Field Effect Transistor) and wirings are formed, and bonding pads 5a are formed on an uppermost layer of the semiconductor chip 5. The bonding pads 5a are connected to wires 6, and the wires 6 are connected to the inner leads 3b.

Figure 3:
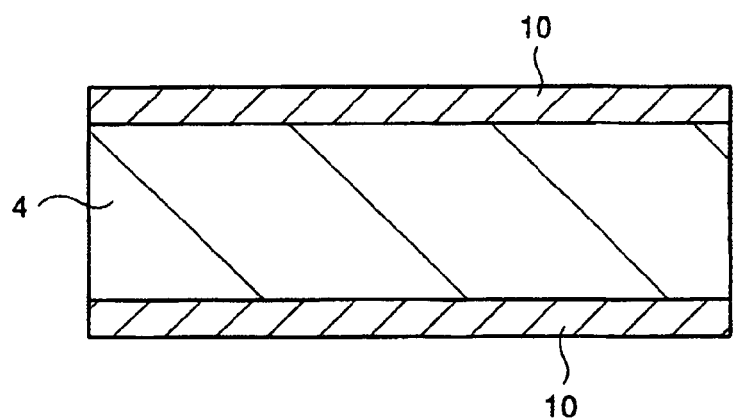
FIG. 3 is an enlarged cross-sectional view showing a part of a tab formed in the semiconductor device in FIG. 2.

FIG. 3 is an enlarged view showing a region C of FIG. 2. More specifically, FIG. 3 is an enlarged cross-sectional view of the tab embedded in the sealing body 2. Further, the enlarged cross-sectional view of the inner lead 3b is similar to FIG. 3. As shown in FIG. 3, a surface layer 10 is formed on a surface (including rear surface) of the tab 4. The surface layer 10 is formed also on a surface (including rear surface) of the inner lead 3b. The tab 4 and the lead 3 are formed by using copper, copper alloy, nickel alloy or iron alloy as a main constituent material. Note that the main constituent material mentioned here means a material having the highest content. In the surface layer 10, copper, palladium, nickel, platinum, ruthenium, gold, silver or the like is used as the main constituent material. In the present invention, as described below in detail, acene such as naphthalene, anthracene, tetracene, pentacene and hexacene is used as a matrix material of the sealing body 2 in order to improve the heat dissipation characteristics from the surface (including rear surface) of the tab 4 and the inner lead 3b to the sealing body 2. In order to further improve the heat dissipation characteristics, boron nitride or aluminum nitride is contained as filler (filling material).

Figure 4:
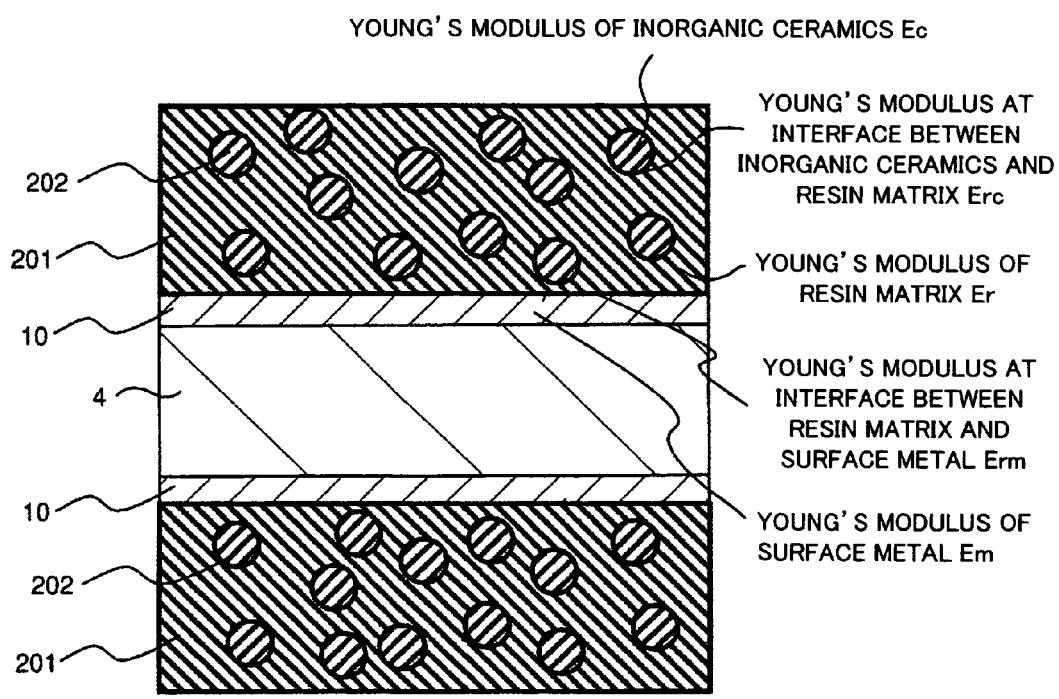
FIG. 4 is a view showing a conventional structure including the peripheral region of FIG. 3 in detail.
Figure 5:
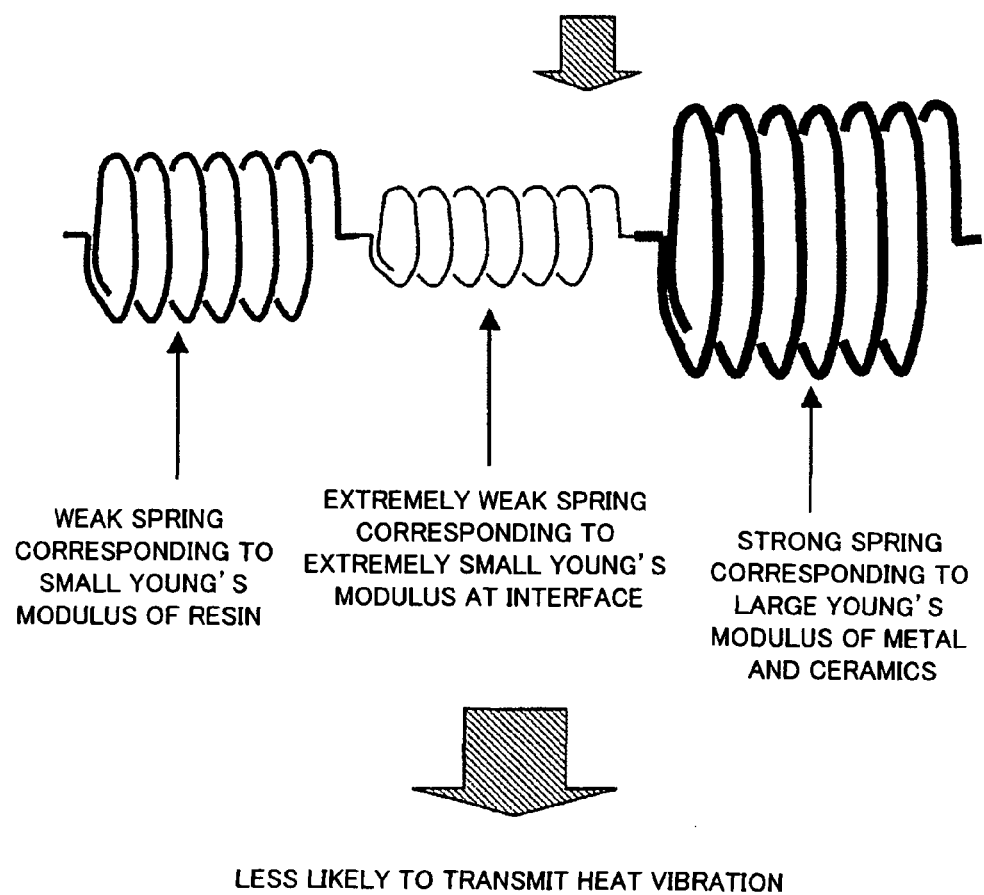
FIG. 5 is a diagram for explaining the relation in Young's modulus in the conventional structure.
Figure 6:
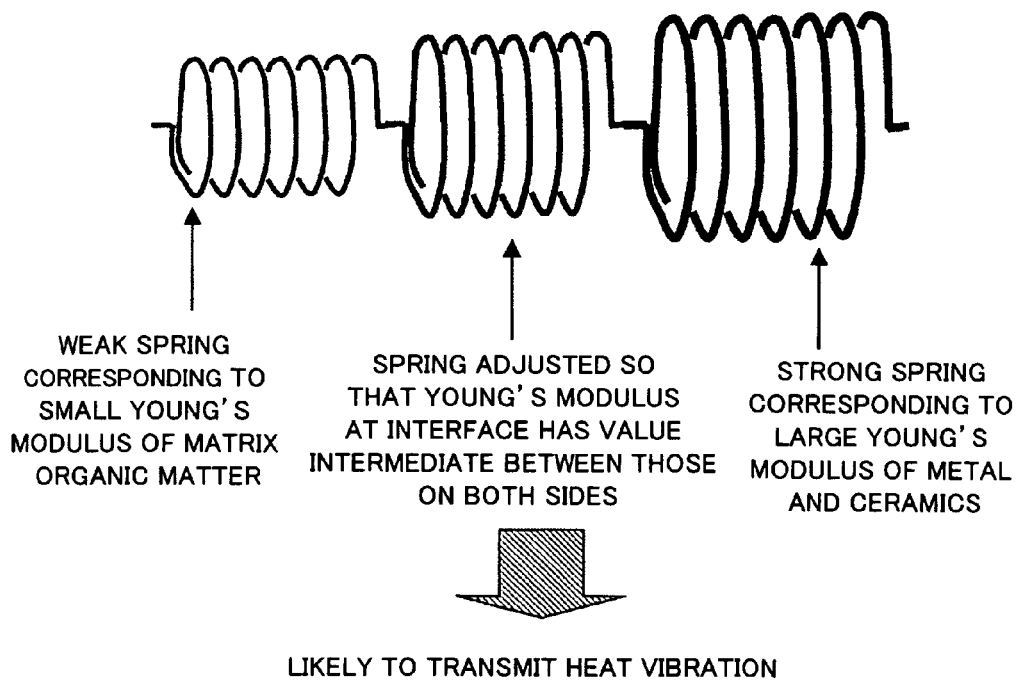
FIG. 6 is a diagram for explaining the relation in Young's modulus in the structure of the present invention.
Figure 8:
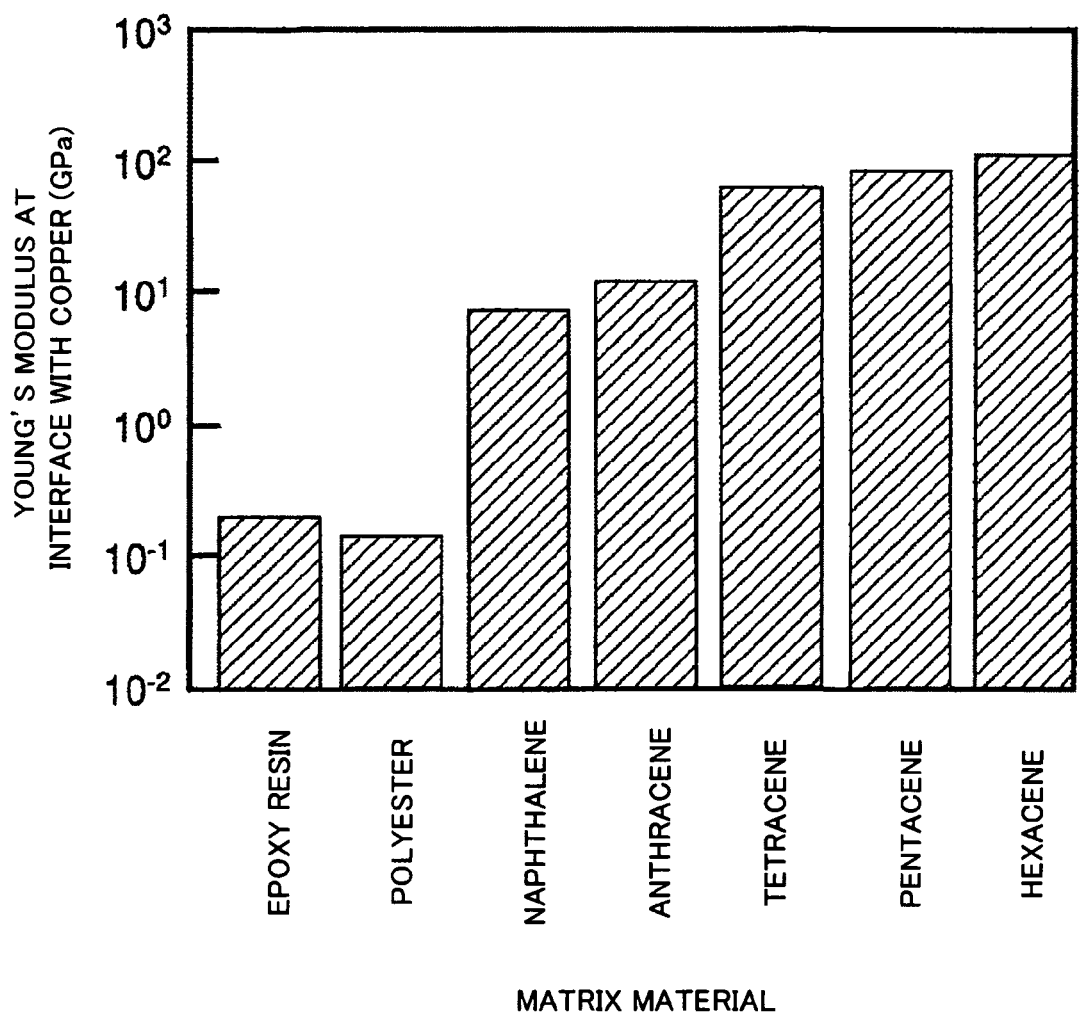
FIG. 8 is a diagram showing the effect to Young's modulus at the interface in the present invention.
Figure 9:
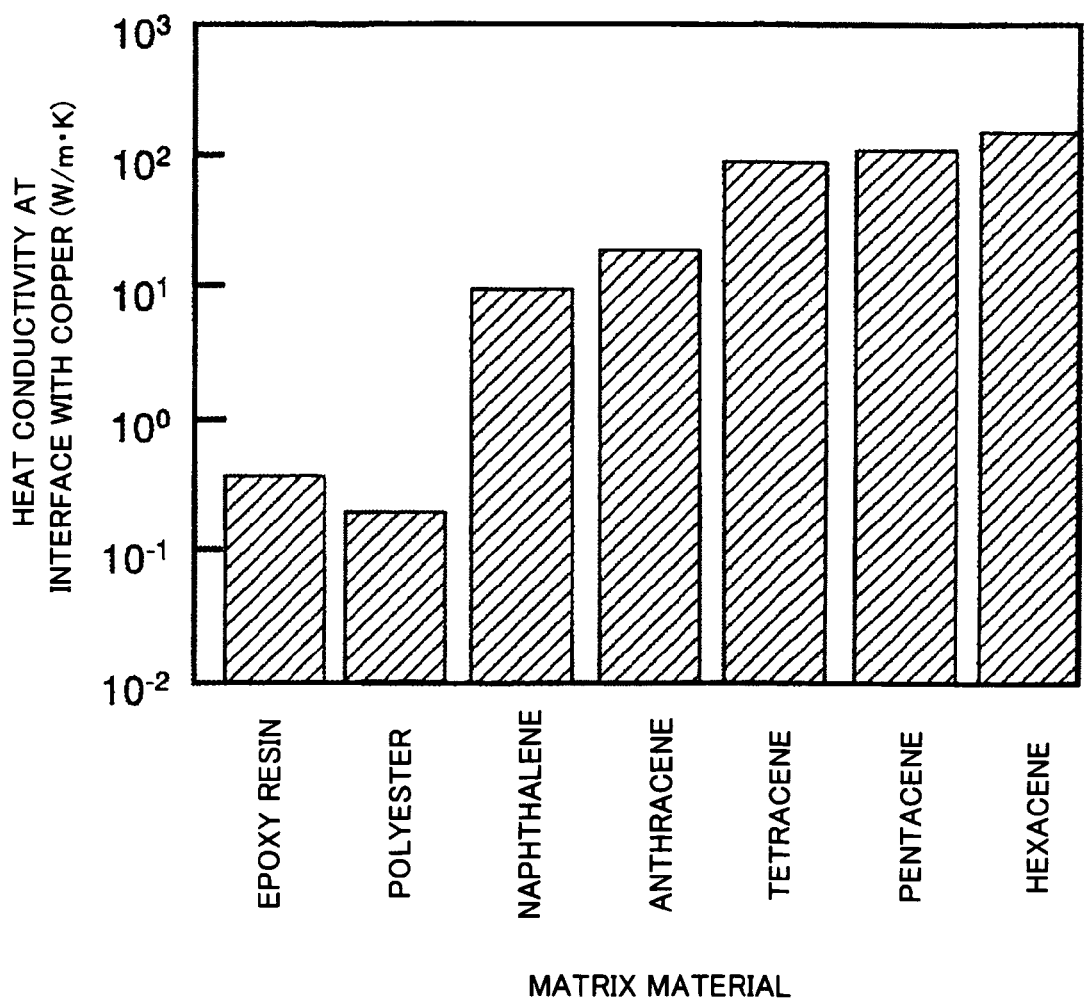
FIG. 9 is a diagram showing the effect to heat conductivity at the interface in the present invention.

FIG. 4 is a view showing a conventional structure including the peripheral region of FIG. 3 in detail. Conventionally, epoxy resin, polyester resin, phenol resin, acrylic resin and others are used as a matrix material 201, but since the heat cannot be conducted well at the interface between the matrix material 201 and the surface (including rear surface) of the tab 4 and the inner lead 3b, the heat dissipation characteristics have become insufficient for the recently-increasing heat generation density in the chip. The inventors of the present invention studied hard for finding out the cause why the heat dissipation characteristics are insufficient in the conventional structure. As a result, the following relation as shown in FIG. 4 was found out. That is, the Young's modulus $Em$ (simply, spring constant of spring that connects atoms) of metal such as copper and palladium which is a surface material of the tab 4 and the inner lead 3b is as large as several tens GPa or more and the Young's modulus $Er$ of resin such as epoxy resin and polyether resin is as small as several GPa, but the Young's modulus $Erm$ at the interface between the metal and the resin is about one-tenth of that of the resin and is smaller than that of the resin. This is the cause why the heat conduction at the interface is low. In other words, since the Young's modulus $Erm$ at the interface is extremely low as shown in FIG. 5 (spring constant is extremely small), the spring is less likely to transmit the heat vibration. Furthermore, the heat transfer at the interface between the epoxy resin, polyether rein, phenol resin, acrylic resin and others which have been conventionally used as the matrix material 201 and filler 202 (inorganic ceramics powder such as silica and alumina) has also become insufficient. The inventors of the present invention studied also for finding out the cause thereof and found out the following fact. That is, as shown in FIG. 4, the Young's modulus $Ec$ of an inorganic ceramics powder such as silica and alumina which has been used as filler is as large as several tens GPa or more and the Young's modulus $Er$ of resin such as epoxy resin and polyether resin is as small as several GPa, but the Young's modulus $Erc$ at the interface between the inorganic ceramics powder and the resin is about one-tenth of that of the resin and is smaller than that of the resin. This is the cause why the heat conduction at the interface is low. In other words, since the Young's modulus $Erc$ at the interface is extremely low as shown in FIG. 5 (spring constant is extremely small), the spring is less likely to transmit the heat vibration. Based on the above-described clarification of the cause, the inventors of the present invention conducted the study for finding out the material configuration capable of achieving the preferable relation in Young's modulus as shown in FIG. 6. The preferable relation in Young's modulus is the relation in which the Young's modulus $Eom$ at the interface between the metal which is the surface material of the tab 4 and the inner lead 3b and the matrix material 201 has a value intermediate between the Young's modulus $Em$ of the metal which is the surface material of the tab 4 and the inner lead 3b and the Young's modulus $Eo$ of the matrix material 201. The hard study by the inventors of the present invention revealed that the preferable relation in Young's modulus can be achieved and the heat dissipation characteristics are improved when acene such as naphthalene, anthracene, tetracene, pentacene and hexacene is used as the matrix material of the sealing body 2. FIG. 8 shows the effect thereof. As can be understood from FIG. 8, when acene is used as the matrix material 201, the Young's modulus at the interface is increased compared with the conventional case in which epoxy resin, polyester resin, phenol resin and acrylic resin which have been used as the matrix material are used, and the Young's modulus at the interface has a value intermediate between the Young's modulus (several tens GPa or more) of metal (copper in FIG. 8) and the Young's modulus (about several GPa) of the matrix material. Furthermore, as can be understood from FIG. 9, when acene is used as the matrix material 201, the heat conductivity at the interface is significantly increased compared with the conventional case in which epoxy resin, polyether resin and others which have been used as the matrix material are used. Note that FIG. 8 and FIG. 9 show the results of the case in which the metal is copper, but the similar effect can be achieved even when other metals are used. Furthermore, although the Young's modulus and the heat conductivity are changed depending on the difference in the plating conditions and the forming method even in the case of the same metal, the same effects as FIG. 8 and FIG. 9 can be achieved nonetheless. Note that, as can be understood from FIG. 8 and FIG. 9, the particularly effective acene is tetracene, pentacene and hexacene.

Figure 10:
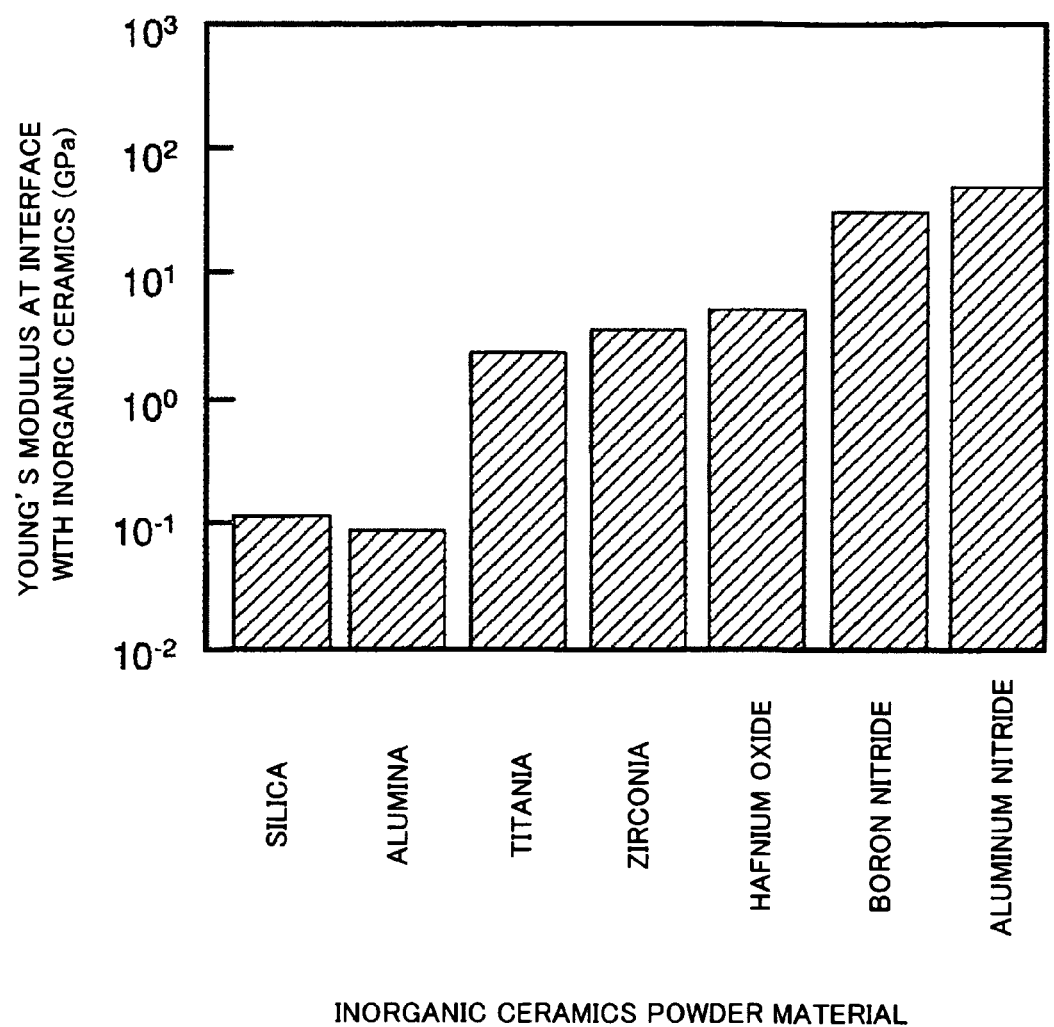
FIG. 10 is a diagram showing the effect to Young's modulus at the interface in the present invention.
Figure 11:
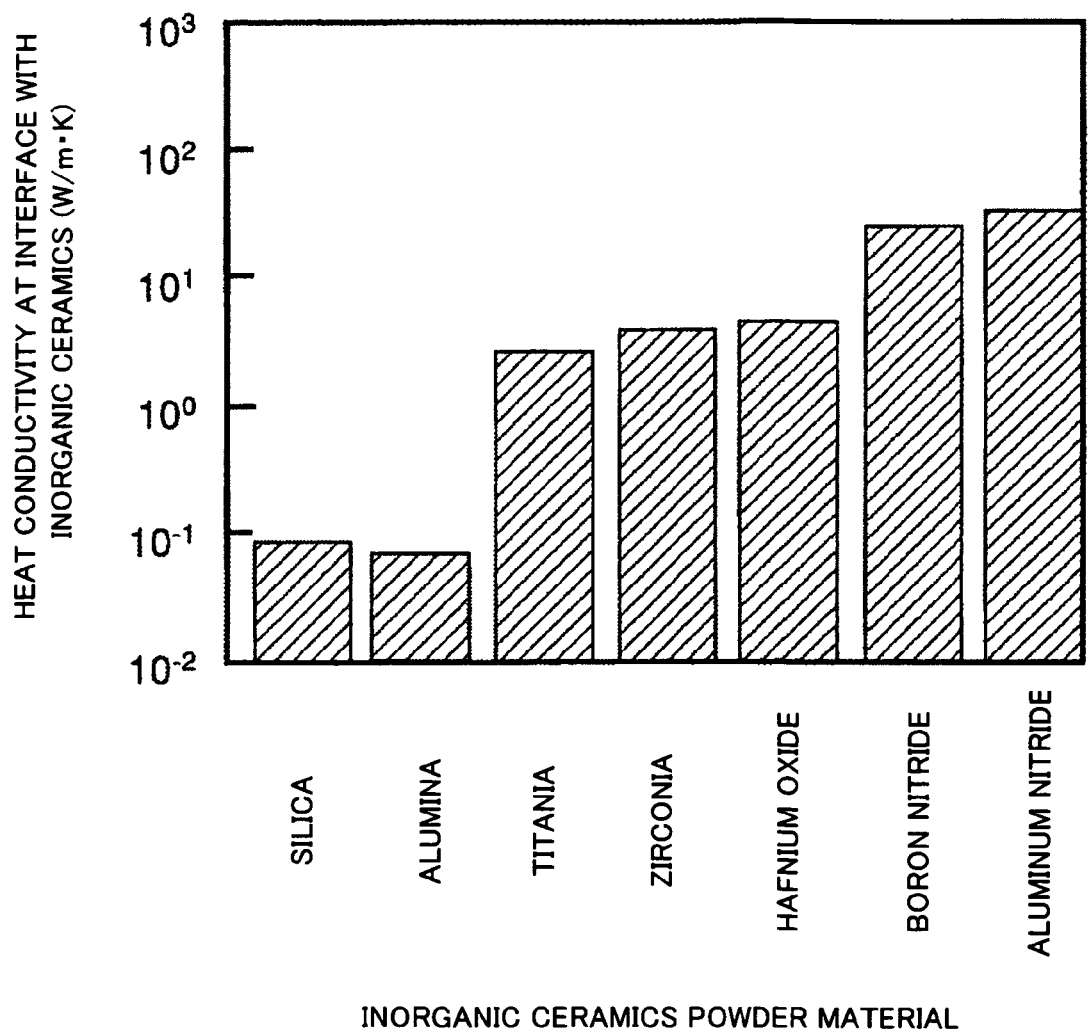
FIG. 11 is a diagram showing the effect to heat conductivity at the interface in the present invention.

Other than those described above, it was also found out that boron nitride and aluminum nitride are effective as the filler material to improve the Young's modulus at the interface between the matrix material 201 made of acene and the filler 202. FIG. 10 shows the effect thereof. Furthermore, FIG. 11 shows the effect to the heat conductivity at the interface. It can be understood from these figures that titania, zirconia and hafnium oxide are more preferable than silica and alumina and boron nitride and aluminum nitride are still more preferable. When boron nitride and aluminum nitride are used, not only the effect of improving the heat conductivity but also the effect of improving the strength of the sealing body can be achieved from the preferable relation in Young's modulus shown in FIG. 10.

Figure 12:
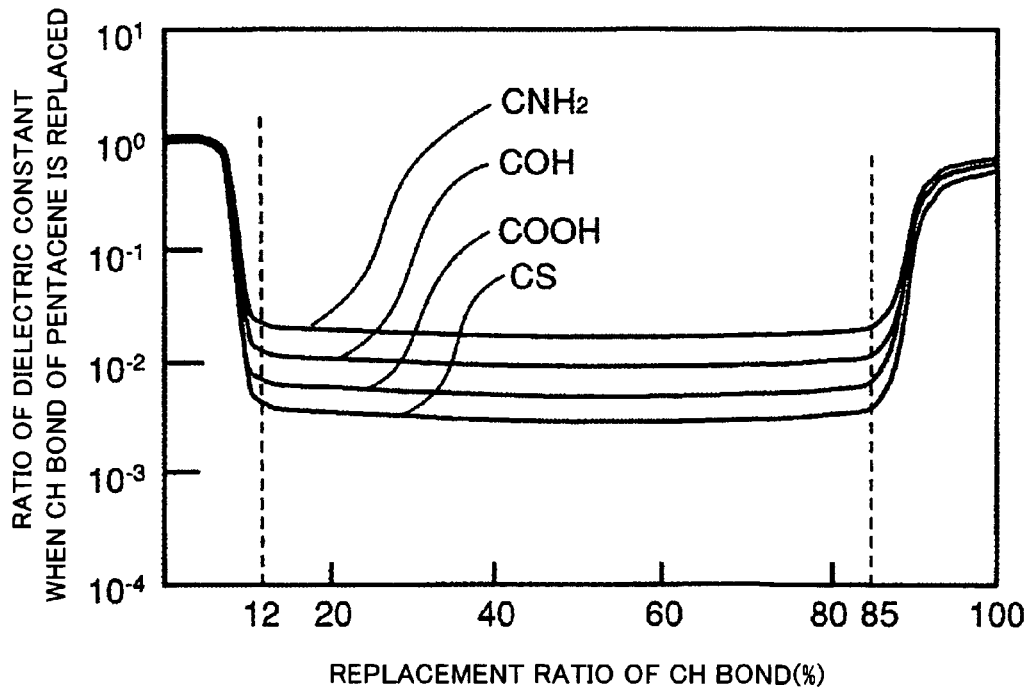
FIG. 12 is a graph showing the replacement ratio of CH bond of pentacene and the ratio of the dielectric constant in the present invention.

In addition to those described above, it was also found out that the dielectric constant is reduced when 12% or more to 85% or less of CH bond of the acene (pentacene in FIG. 12) is replaced by COOH, COH, $CNH_2$ and CS as shown in FIG. 12. Since the electrical wiring delay is suppressed when the dielectric constant is reduced, it is preferable in terms of the electrical characteristics. Note that the dielectric constant before the replacement is assumed to be 1 in FIG. 12. Furthermore, although FIG. 12 shows the case of using pentacene as acene, the similar effect can be achieved also in the case of using other acenes (illustration thereof is omitted).

Conventionally, a plating film mainly made of tin (Sn) is formed on the outer lead 3a in some cases. This is for the following reason and is preferably applied to the present embodiment. The semiconductor device 1 shown in FIG. 1 is mounted on a mounting board, and at this time, terminals formed on the mounting board and the leads 3 formed in the semiconductor device 1 are electrically connected. Solder is used for the electrical connection between the terminal and the lead 3. Therefore, although it is possible to directly connect the lead 3 made of copper and the terminal with solder, the plating film 10 is formed on the surface of the lead 3 in order to improve the wettability of the lead 3 to the solder. By forming the plating film 10 on the surface of the lead 3 as described above, the wettability between the lead 3 and the solder is improved, and the connection reliability between the lead 3 and the terminal on the mounting board through the solder can be improved. A film mainly made of tin having good wettability to solder is used for the plating film 10. Furthermore, by using the plating film 10 on the surface of the lead 3, the corrosion and oxidation prevention of the lead 3 can be achieved.

Next, a manufacturing method of a semiconductor device according to the first embodiment will be described. The QFP has been described above as the package type of the semiconductor device according to the first embodiment, but the SOP (Small Outline Plastic Package) which is the surface-mounting package like the QFP will be described in the following manufacturing method. The basic manufacturing process is the same no matter which package type of the QFP and the SOP is employed.

Figure 13:
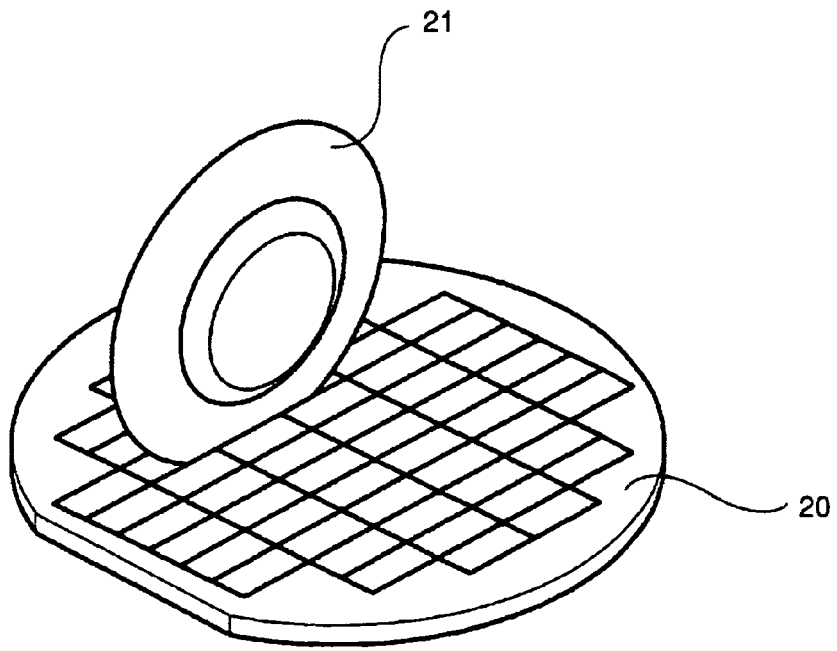
FIG. 13 is a perspective view showing the manufacturing process of the semiconductor device according to the first embodiment for explaining the dicing process.

First, in FIG. 13, a semiconductor wafer 20 is prepared. The semiconductor wafer 20 is partitioned into a plurality of chip regions, and LSI (Large Scale Integration Circuit) is formed in each of the plurality of chip regions. The LSI is formed in the so-called wafer process (front-end process). Subsequently, the semiconductor wafer 20 is cut by a blade 21. More specifically, the semiconductor wafer 20 is cut into respective chip regions, thereby obtaining semiconductor chips. On the other hand, a lead frame for mounting the semiconductor chip is prepared. This lead frame 22 is mainly made of, for example, copper. Then, a plating film is formed on the surface of the leads formed in the lead frame. The technical idea according to the first embodiment is embodied in this plating process. For example, as described above, a gold film is first formed on the surface of the lead by the electroplating method. Thereafter, a plating film mainly made of tin is formed on the gold film by the electroplating method.

Figure 14:
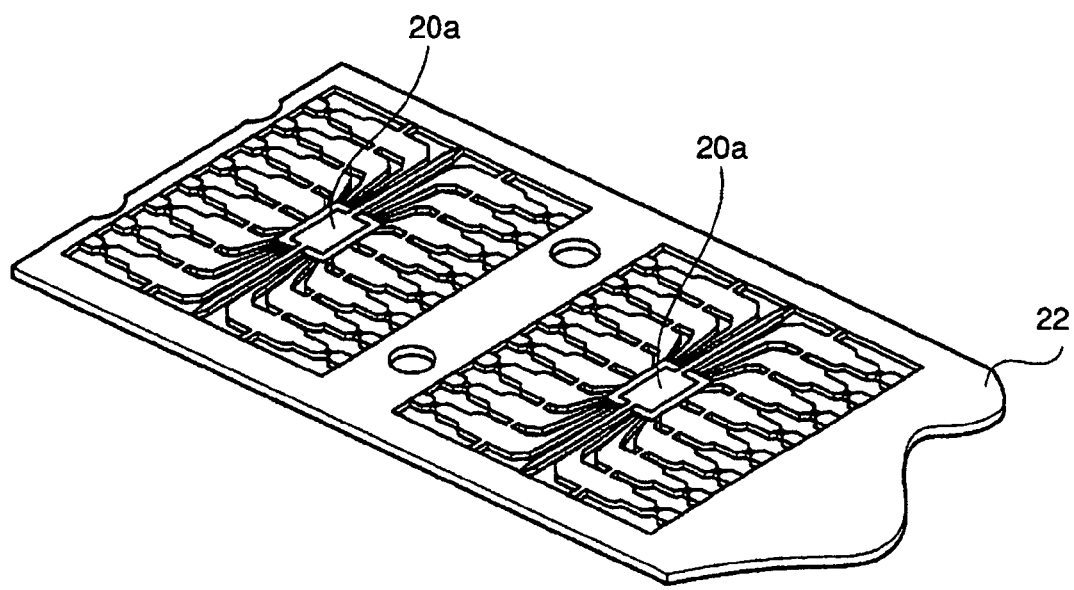
FIG. 14 is a perspective view showing the manufacturing process continued from FIG. 13 for explaining the process of mounting a semiconductor chip on a lead frame.

Then, as shown in FIG. 14, a semiconductor chip 20a is mounted on a tab of the lead frame 22 in which the plated lead pattern is formed. The semiconductor chip 20a is mounted on the tab formed in the lead frame 22 by the die bonder.

Figure 15:
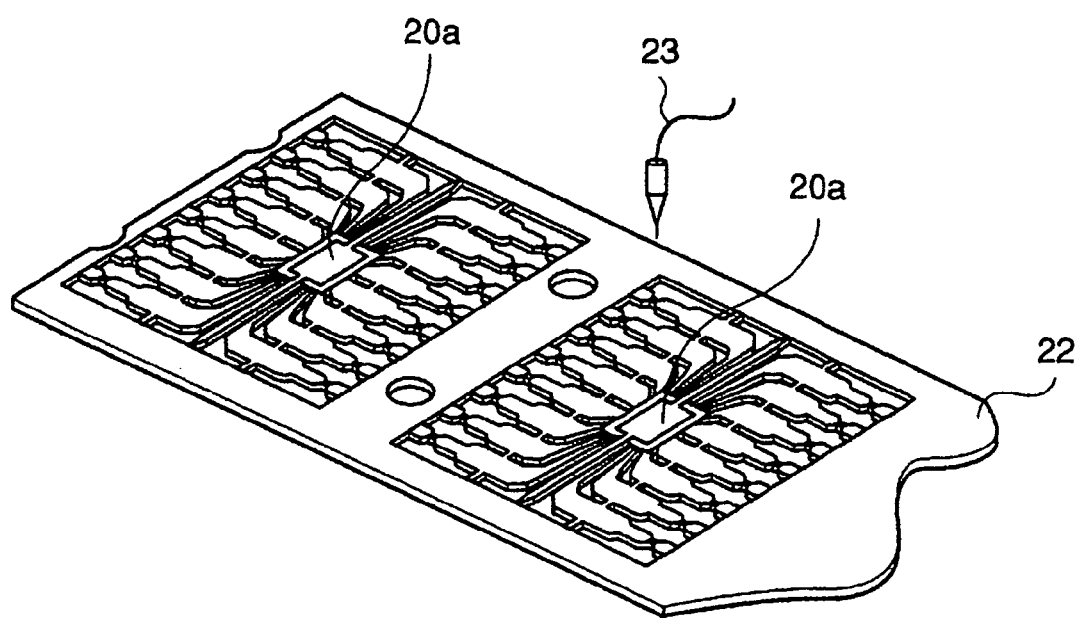
FIG. 15 is a perspective view showing the manufacturing process continued from FIG. 14 for explaining the process of electrically connecting the semiconductor chip and the lead by a wire.

Next, as shown in FIG. 15, pads (not shown) formed on the semiconductor chip 20a mounted on the tab are connected to the plurality of leads (inner leads) formed in the lead frame 22 by wires 23. The wire 23 connects the pad and the lead by using capillary.

Figure 7:
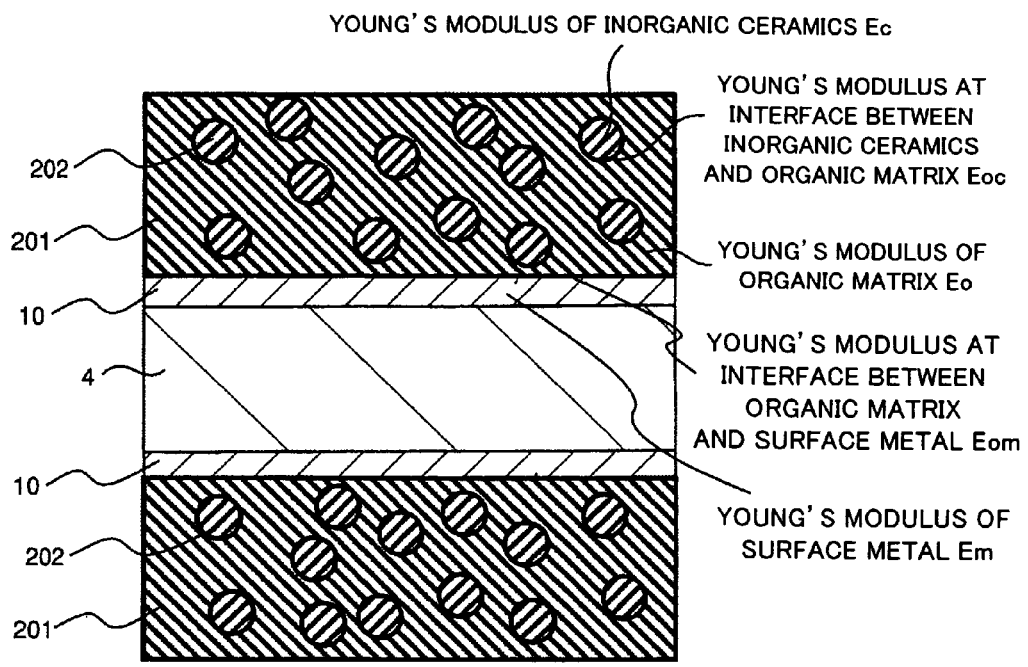
FIG. 7 is a view showing a structure of the present invention including the peripheral region of FIG. 3 in detail.
Figure 16:
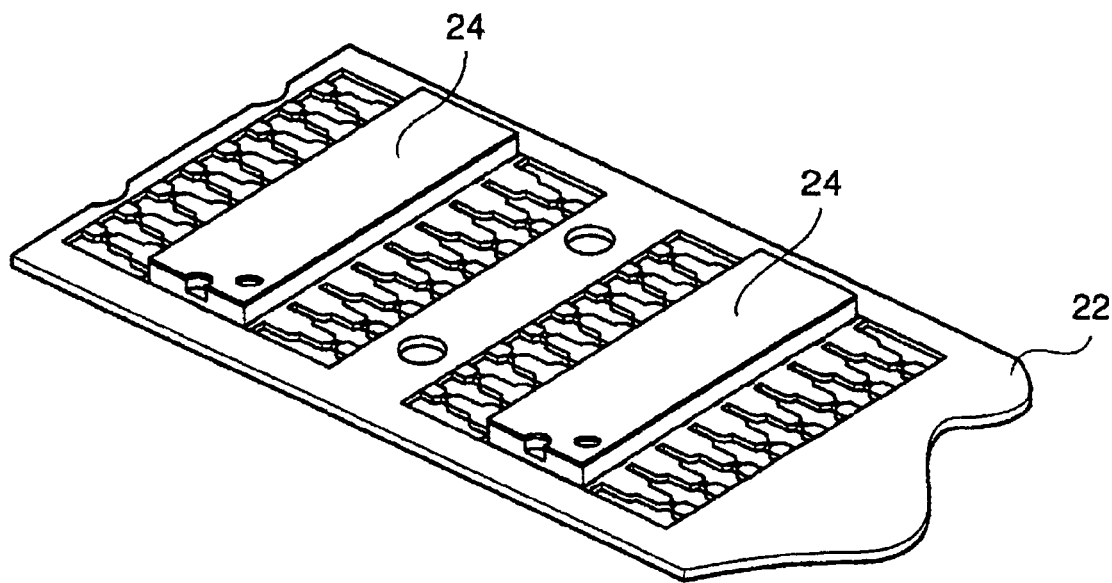
FIG. 16 is a perspective view showing the manufacturing process continued from FIG. 15 for explaining the process of sealing the semiconductor chip with resin.

Thereafter, as shown in FIG. 16, the region including the semiconductor chip 20a mounted on the lead frame 22 and the inner lead is sealed by a sealing body 24. The sealing by the sealing body 24 is made for the protection of the semiconductor chip 20 from the impact by the external force and the invasion of water. The sealing body 24 is formed by coating 1,2,4-trichlorobenzene or 3,4-dichlorotoluene in which the acene serving as the matrix material 201 and the inorganic ceramics powder 202 serving as the filler shown in FIG. 7 are dissolved and then evaporating the solvent by applying the heat of 180 to 200° C. It is more preferable to form a highly insulative structure by thinly coating the epoxy resin or polyether resin mixed with ceramic filler, which has been conventionally used, to about 100 micron or less without decreasing the heat conductivity and then thermally setting the resin at the temperature of 130 to 220° C.

Figure 17:
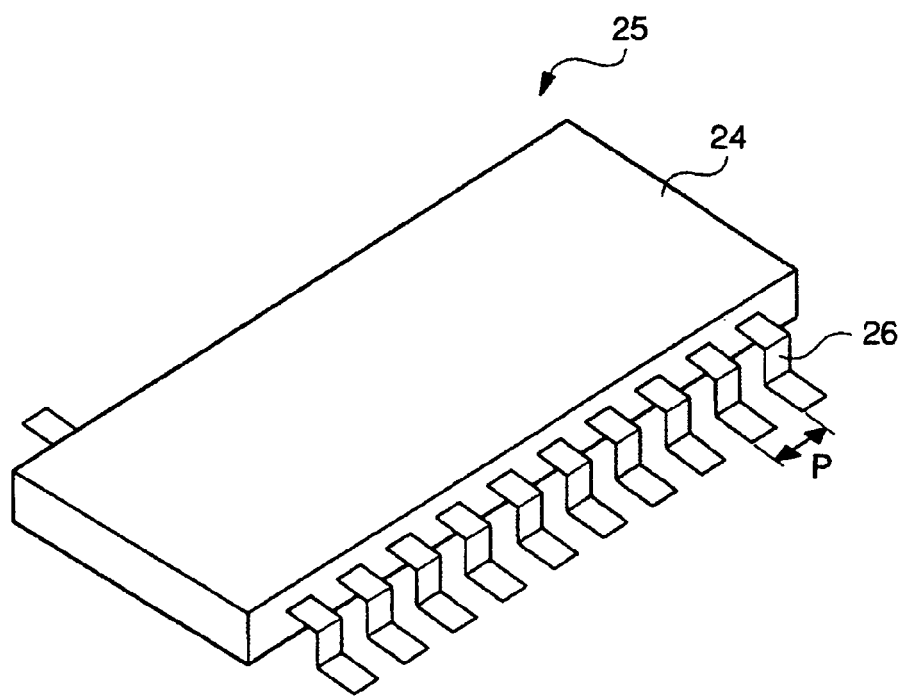
FIG. 17 is a perspective view showing an outer appearance of a semiconductor device according to the first embodiment.

Next, individual pieces of the sealing body 24 are separated from the lead frame 22. In this manner, a semiconductor device 25 shown in FIG. 17 can be obtained. The semiconductor device 25 is made up of the sealing body 24 and leads (outer leads) 26 protruded from the sealing body. Also, the plating film (not shown) is formed on the surface of the leads 26 protruded from the sealing body.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be widely used in the manufacturing industry of the semiconductor devices.

What is claimed is:

1. A semiconductor device comprising: a semiconductor chip; a plurality of leads electrically connected to the semiconductor chip and mainly made of metal; and a sealing body for sealing the semiconductor chip,
    wherein the sealing body comprises at least one selected from a group including tetracene, pentacene, and hexacene as a main constituent of matrix material of the sealing body,
    the sealing body contains an inorganic ceramics powder comprised of at least one selected from a group including boron nitride and aluminum nitride as a filler, and
    a circumference of the filler is covered by the matrix material.

2. The semiconductor device according to claim 1,
    wherein 12% or more to 85% or less of CH bond of the matrix material is replaced by COOH, COH, $CNH_2$ and CS.

3. The semiconductor device according to claim 2,
    wherein the sealing body contains resin comprised of at least one selected from a group of epoxy resin, polyester resin, phenol resin and acrylic resin as an additive.

4. A semiconductor device comprising: a semiconductor chip; a plurality of leads electrically connected to the semiconductor chip and mainly made of metal; and a sealing body for sealing the semiconductor chip,
    wherein the sealing body comprised at least one selected from a group including tetracene, pentacene, and hexacene as a main constituent material,
    the sealing body contains an inorganic ceramics powder comprised of at least one selected from a group including boron nitride and aluminum nitride as filler,
    a circumference of the filler is covered by the matrix material, and
    each part of the plurality of leads has an outer lead portion exposed from the sealing body and an inner lead portion embedded in the sealing body, and copper or palladium comprises a main constituent material of a surface material of the inner lead portion.

5. The semiconductor device according to claim 4,
    wherein 12% or more to 85% or less of CH bond of the matrix material is replaced by COOH, COH, $CNH_2$ and CS.

6. The semiconductor device according to claim 5,
    wherein the sealing body contains resin comprised of at least one selected from a group of epoxy resin, polyester resin, phenol resin and acrylic resin as an additive.

* * * * *

UNITED STATES PATENT AND TRADEMARK OFFICE
CERTIFICATE OF CORRECTION

| | |
|---|---|
| PATENT NO. | : 8,653,650 B2 |
| APPLICATION NO. | : 12/805834 |
| DATED | : February 18, 2014 |
| INVENTOR(S) | : T. Iwasaki |

It is certified that error appears in the above-identified patent and that said Letters Patent is hereby corrected as shown below:

On the Title Page, at item (*) delete "This patent is subject to a terminal disclaimer.".

Signed and Sealed this
Twenty-fifth Day of November, 2014

Michelle K. Lee
*Deputy Director of the United States Patent and Trademark Office*